United States Patent
Rowitch et al.

(10) Patent No.: US 6,637,000 B2
(45) Date of Patent: Oct. 21, 2003

(54) TURBO CODE INTERLEAVER USING LINEAR CONGRUENTIAL SEQUENCES

(75) Inventors: Douglas N. Rowitch, Del Mar, CA (US); Fuyun Ling, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/933,979

(22) Filed: Aug. 20, 2001

(65) Prior Publication Data

US 2002/0032890 A1 Mar. 14, 2002

Related U.S. Application Data

(63) Continuation of application No. 09/205,511, filed on Dec. 4, 1998, now Pat. No. 6,304,991.

(51) Int. Cl.[7] .............................................. H03M 13/00
(52) U.S. Cl. ...................................................... 714/755
(58) Field of Search ............................... 714/755, 756, 714/758, 728, 739; 375/259

(56) References Cited

U.S. PATENT DOCUMENTS

| | | | |
|---|---|---|---|
| 5,103,459 A | 4/1992 | Gilhousen et al. | |
| 5,392,299 A | 2/1995 | Phines et al. | |
| 5,633,881 A | 5/1997 | Zehavi et al. | |
| 5,907,582 A | 5/1999 | Yi | |
| 5,978,365 A | 11/1999 | Yi | |
| 6,014,411 A | 1/2000 | Wang | |
| 6,304,991 B1 * | 10/2001 | Rowitch et al. | 714/755 |
| 6,430,722 B1 * | 8/2002 | Eroz et al. | 714/755 |

FOREIGN PATENT DOCUMENTS

EP          0582827          2/1994

OTHER PUBLICATIONS

Clark et al., Interleaver Structures for Coded Systems, *Error Correction Coding for Digital Communications*, Plenum Press, pp. 345–352, 1991.
Krishna, "A Novel ARQ Technique Using the Turbo Coding Principal", IEEE Communications Letter 1(2): 49–51, 1997.

* cited by examiner

*Primary Examiner*—Phung M. Chung
(74) *Attorney, Agent, or Firm*—Philip Wadsworth; Kent Baker; Sandra L. Godsey

(57) ABSTRACT

A turbo code interleaver using linear congruential sequences may be employed as a two-dimensional interleaver in a turbo coder that also includes first and second constituent encoders. The interleaver and the first encoder are each configured to receive input bits. The first encoder produces output symbols therefrom. The interleaver receives the input bits sequentially by row. A linear congruential sequence recursion algorithm within the interleaver serves to pseudo-randomly rearrange, or shuffle, the bits within each row of the interleaver. The bits are then output from the interleaver sequentially by column. The second encoder is configured to receive the interleaved bits from the interleaver. The second encoder produces output symbols therefrom. The two streams of output symbols are multiplexed together, with appropriate puncturing. If desired, the linear congruential recursion sequence can be generated in reverse.

10 Claims, 3 Drawing Sheets

TURBO CODE INTERLEAVER USING LINEAR CONGRUENTIAL SEQUENCES

CROSS-REFERENCE TO CO-PENDING APPLICATION

This application is a continuation of U.S. application Ser. No. 09/205,511, filed Dec. 4, 1998, now U.S. Pat. No. 6,304,991, entitled Turbo Code Interleaver Using Linear Congruential Sequences, assigned to the assignee of the present invention.

FIELD OF THE INVENTION

The present invention pertains generally to the field of coding for communications systems, and more specifically to interleavers for turbo coders.

BACKGROUND

Transmission of digital data is inherently prone to interference, which may introduce errors into the transmitted data. Error detection schemes have been suggested to determine as reliably as possible whether errors have been introduced into the transmitted data. For example, it is common to transmit data in packets and add to each packet a cyclic redundancy check (CRC) field, for example of a length of sixteen bits, which carries a checksum of the data of the packet. When a receiver receives the data, the receiver calculates the same checksum on the received data and verifies whether the result of the calculation is identical to the checksum in the CRC field.

When the transmitted data is not used on-line, it is possible to request retransmission of erroneous data when errors are detected. However, when the transmission is performed on-line, such as, e.g., in telephone lines, cellular phones, remote video systems, etc., it is not possible to request retransmission.

Convolutional codes have been introduced to allow receivers of digital data to correctly determine the transmitted data even when errors may have occurred during transmission. The convolutional codes introduce redundancy into the transmitted data and pack the transmitted data into packets in which the value of each bit is dependent on earlier bits in the sequence. Thus, when errors occur, the receiver can still deduce the original data by tracing back possible sequences in the received data.

To further improve the performance of a transmission channel, some coding schemes include interleavers, which mix up the order of the bits in the packet during coding. Thus, when interference destroys some adjacent bits during transmission, the effect of the interference is spread out over the entire original packet and can more readily be overcome by the decoding process. Other improvements may include multiple-component codes that encode the packet more than once, in parallel or in series. For example, it is known in the art to employ an error correction method that uses at least two convolutional coders in parallel. Such parallel encoding is commonly referred to as turbo coding.

For multiple-component codes, optimal decoding is often a very complex task, and may require large periods of time not usually available for on-line decoding. Iterative decoding techniques have been developed to overcome this problem. Rather than determining immediately whether received bits are zero or one, the receiver assigns each bit a value on a multilevel scale representative of the probability that the bit is one. A common scale, referred to as log-likelihood ratio (LLR) probabilities, represents each bit by an integer in some range, e.g., {−32,31}. A value of 31 signifies that the transmitted bit was a zero with very high probability, and a value of −32 signifies that the transmitted bit was a one, with very high probability. A value of zero indicates that the logical bit value is indeterminate.

Data represented on the multilevel scale is referred to as "soft data," and iterative decoding is usually soft-in/soft-out, i.e., the decoding process receives a sequence of inputs corresponding to probabilities for the bit values and provides as output corrected probabilities, taking into account constraints of the code. Generally, a decoder that performs iterative decoding uses soft data from former iterations to decode the soft data read by the receiver. During iterative decoding of multiple-component codes, the decoder uses results from decoding of one code to improve the decoding of the second code. When parallel encoders are used, as in turbo coding, two corresponding decoders may conveniently be used in parallel for this purpose. Such iterative decoding is carried out for a plurality of iterations until it is believed that the soft data closely represents the transmitted data. Those bits that have a probability indicating that they are closer to one (for example, between 0 and 31 on the scale described above) are assigned binary zero, and the remaining bits are assigned binary one.

"Turbo coding" represents an important advancement in the area of forward error correction (FEC). There are many variants of turbo coding, but most types of turbo coding use multiple encoding steps separated by interleaving steps combined with the use of iterative decoding. This combination provides previously unavailable performance with respect to noise tolerance in a communications system. Namely, turbo coding allows communications at levels of energy-per-bit per noise power spectral density ($E_b/N_0$) that were previously unacceptable using the existing forward error correction techniques.

Many communications systems use forward error correction techniques and therefore would benefit from the use of turbo coding. For example, turbo codes could improve the performance of wireless satellite links, in which the limited downlink transmit power of the satellite necessitates receiver systems that can operate at low $E_b/N_0$ levels.

Digital wireless telecommunication systems, for example, such as, e.g., digital cellular and PCS telephone systems, also use forward error correction. For example, the Telecommunications Industry Association has promulgated the over-the-air interface standard TIA/EIA Interim Standard 95, and its derivatives, such as, e.g., IS-95B (hereinafter referred to collectively as IS-95), which define a digital wireless communications system that uses convolutional encoding to provide coding gain to increase the capacity of the system. A system and method for processing radio-frequency (RF) signals substantially in accordance with the use of the IS-95 standard is described in U.S. Pat. No. 5,103,459, which is assigned to the assignee of the present invention and fully incorporated herein by reference.

There is an ongoing drive in the communications industry to continually improve coding gains. In conventional digital wireless communications systems, it has been found that a serial interleaver for turbo coding may be advantageously implemented with a congruent random sequence. It is known in the art that a uniform random sequence may be generated by using a linear congruential recursion algorithm. See, e.g., 2 D. Knuth *The Art of Computer Programming* (1969) (describing generation of pseudo-random numbers with linear congruential recursion). It has also been found that a parallel turbo coder employing a two-dimensional interleaver (i.e., an interleaver organized as a rectangular data array comprising rows and columns) generally outperforms a parallel turbo coder having a one-dimensional interleaver (i.e., an interleaver in which the data is organized as a single, linear array) in terms of coding gain.

It would be advantageous to further enhance the performance of a turbo coder. Additionally, as turbo coders are significantly more complex to implement than are convolutional coders, it would be desirable to provide a turbo coder implementation with reduced complexity. Thus, there is a need for a reduced-complexity, two-dimensional interleaver that uses multiple linear congruential sequences.

SUMMARY OF THE INVENTION

The present invention is directed to a reduced-complexity, two-dimensional interleaver that uses multiple linear congruential sequences. Accordingly, in one aspect of the invention, a turbo coder advantageously includes a first coder configured to receive a plurality of input bits in succession and generate a first plurality of output symbols therefrom; an interleaver configured to receive the plurality of input bits in succession, the interleaver including a plurality of bit storage locations arranged in a matrix of rows and columns and a linear congruential sequence generator configured to pseudo-randomly generate a sequence for shuffling bits within each row of the interleaver; and a second coder configured to receive a plurality of interleaved bits in succession from the interleaver and generate a second plurality of output symbols therefrom.

In another aspect of the invention, a method of interleaving data elements advantageously includes the steps of writing data elements sequentially by rows to a matrix of bit storage locations; pseudo-randomly rearranging the data elements within each row in the matrix of bit storage locations in accordance with a linear congruential sequence recursion; and reading the data elements sequentially by columns from the matrix of bit storage locations.

In another aspect of the invention, an interleaver advantageously includes means for writing data elements sequentially by rows to a matrix of bit storage locations; means for pseudo-randomly rearranging the data elements within each row in the matrix of bit storage locations in accordance with a linear congruential sequence recursion; and means for reading the data elements sequentially by columns from the matrix of bit storage locations.

DETAILED DESCRIPTION OF THE PREFERRED EMBODIMENTS

Figure 1:
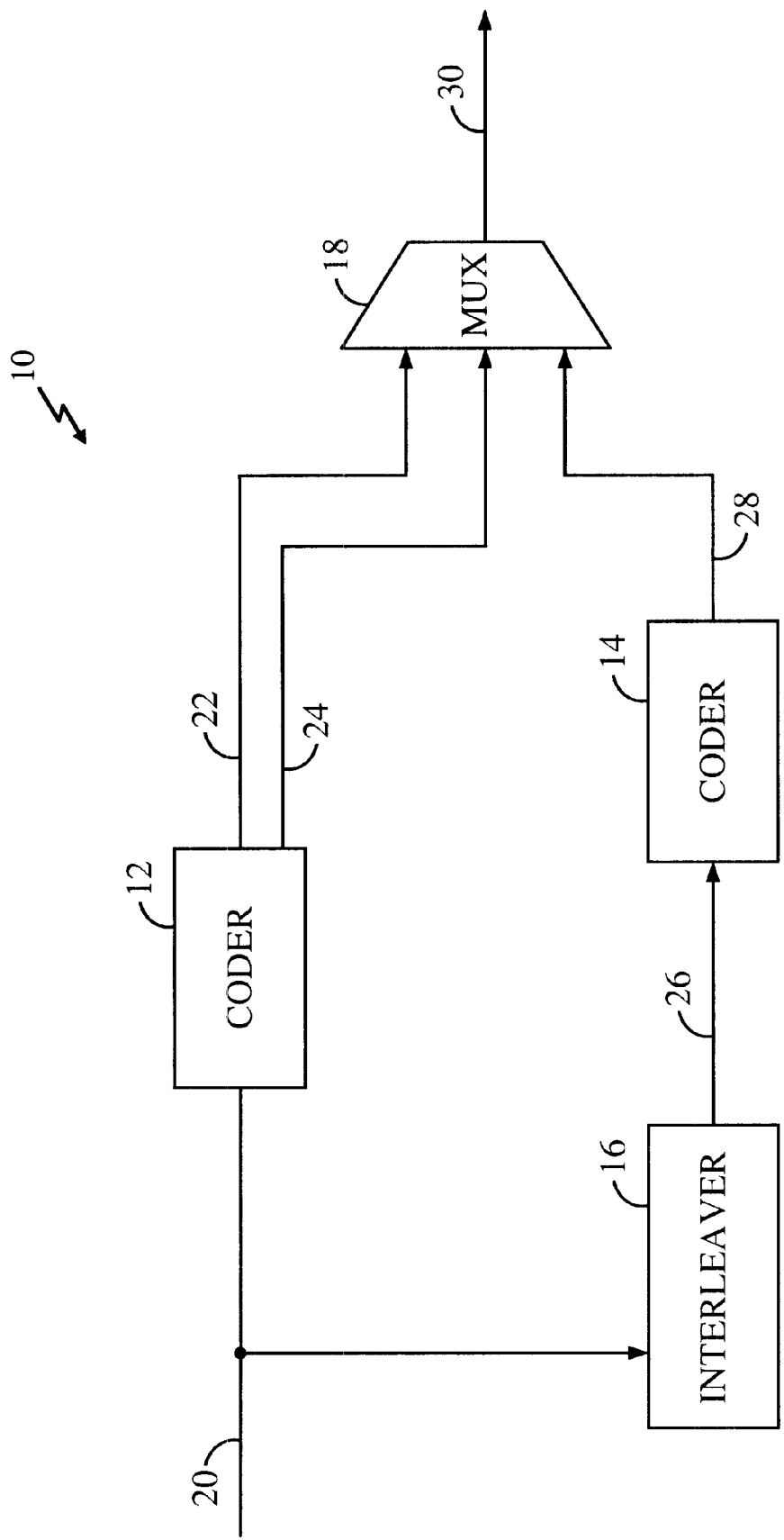
FIG. 1 is a block diagram of a parallel concatenated turbo coder.

In accordance with one embodiment, as illustrated in FIG. 1, a parallel concatenated turbo encoder 10, or turbo coder 10, includes first and second coders 12, 14, an interleaver 16, and a multiplexer 18. The first coder 12 and the interleaver 16 are configured to receive encoder input data 20, which is typically user information or control data. The first coder 12 outputs systematic symbols 22, which are typically a copy of the original input bits 20, and parity symbols 24. The second coder 14 is configured to receive an interleaved output 26 of the interleaver 16 and to output a second set of parity symbols 28. The systematic symbols (not shown) generated by the second coder 14 are suppressed, and the remaining respective outputs 22, 24, 28 of the first and second coders 12, 14 are multiplexed by the multiplexer 18 into an output data stream 30.

Additional coder and interleaver pairs may be added in parallel to reduce the coding rate, thereby providing enhanced forward error correction. Alternatively, some of the systematic symbols 22 and/or parity symbols 24 may be punctured to increase the coding rate and provide improved spectral efficiency.

The first and second coders 12, 14 may be various types of coders known in the art, including block coders and convolutional coders. Exemplary block coders and convolutional coders are described in Bernard Sklar, *Digital Communications* 245–380 (1988), which is incorporated herein by reference. The first and second coders 12, 14 are advantageously convolutional coders with relatively small constraint lengths K such as, e.g., K=4, thereby providing reduced complexity because the low constraint lengths reduce the complexity of the corresponding decoders (not shown). The first and second coders 12, 14 are also advantageously recursive systematic convolutional (RSC) encoders, as known in the art. The interleaver 16 is advantageously a two-dimensional interleaver, as described below.

Typically, the first and second coders 12, 14 output two parity symbols 24, 28 for each bit 20 received, yielding a coding rate R=½ for each coder 12, 14. Nevertheless, the total coding rate for the turbo coder 10 is R=⅓ because the systematic bit from the second coder 14 is punctured.

Figure 2:
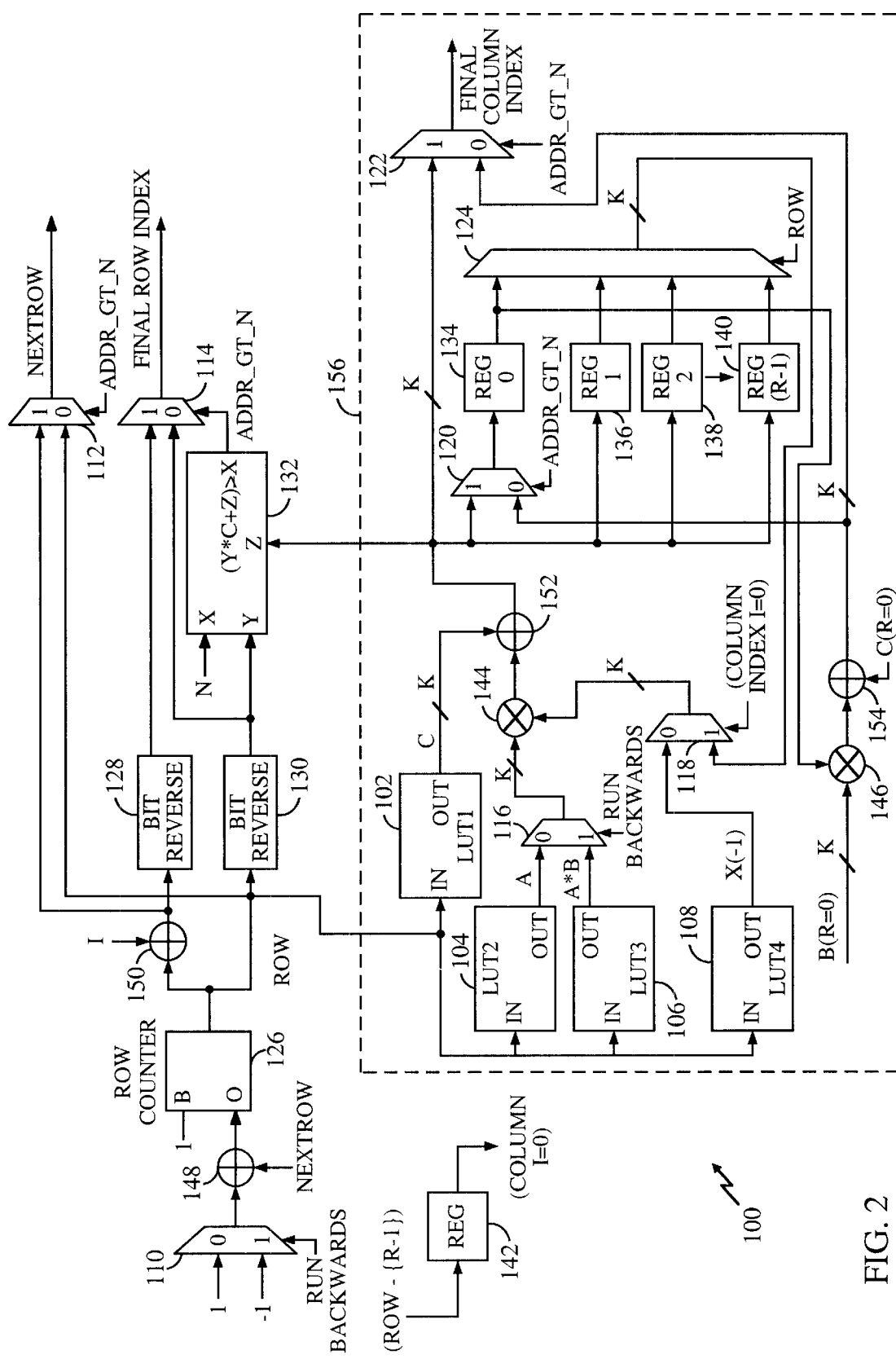
FIG. 2 is a block diagram of an interleaver that may be used in the parallel concatenated turbo coder of FIG. 1.

As shown in FIG. 2, a two-dimensional (2-D), linear congruential sequence (LCS) interleaver 100 in accordance with one embodiment includes four lookup tables (LUTs) 102, 104, 106, 108, seven two-input multiplexers (MUXes) 110, 112, 114, 116, 118, 120, 122, an R-input MUX 124, a row counter 126, first and second bit-reversal logic blocks 128, 130, an address validation module 132, a plurality, R, of column index, or row, registers 134, 136, 138, 140 (shown for simplicity as four registers), a register 142 for flagging column index reset, first and second k-bit multipliers 144, 146, and four k-bit adders 148, 150, 152, 154. An LCS recursion generator 156 is depicted by a dashed-line enclosure. The interleaver 100 may be used in the parallel concatenated turbo coder of FIG. 1, or alternatively, the interleaver 100 may be used in a serial concatenated turbo coder in which the interleaver 100 is positioned between the outer and the inner component codes, as would be understood by those skilled in the art.

The size of the interleaver 100 is N, which is less than or equal to $2^m$ and greater than $2^{m-1}$. The number of rows, R, multiplied by the number of columns, C, equals $2^m$. The number of columns, C, equals $2^k$, i.e., $k=\log_2 C$. The number of rows, R, equals $2^r$, i.e., $r=\log_2 R$.

The address validation module 132 may advantageously be implemented as discrete gate logic configured as a shift register and an adder. The address validation module 132 serves to check whether an X input is less than the product of a column number C and a Y input (a row index), summed with a Z input (a column index), performing, e.g., a shift and add function. The address validation module 132 serves to generate a flag that indicates whether the address is invalid, i.e., whether the address contains bits in excess of a power of 2 (i.e., whether the interleaver size is between successive powers of 2) that should be discarded.

The LCS recursion generator 156 serves to pseudo-randomly rearrange, or shuffle, the bit values contained in each row of the interleaver 100, as described below, by receiving a row number value at the inputs to the four LUTs 102, 104, 106, 108 and generating a column index (the Z input to the address validation module 132). Those skilled in the art would understand that in a parallel concatenated turbo coder such as illustrated in FIG. 1, a physical rearrangement of the data elements may advantageously be circumvented in favor of using the pseudo-randomly generated LCS on the read addressed by the second encoder. The first and second bit-reversal logic blocks 128, 130 serve to rearrange, or shuffle, the rows within the interleaver 100 in accordance with a predefined bit-reversal rule, as described below and as known in the art.

The LUTs 102, 104, 106, 108 may be implemented as any storage media known in the art. The first LUT 102 is used to store values of a coefficient c. The second LUT 104 is used to store values of a coefficient a. The third LUT 106 is used to store values of a coefficient a taken to the power of a coefficient b. The fourth LUT 108 is used to store values of x(−1). The size of each LUT 102, 104, 106, 108 is r×k bits. Total memory requirements for the interleaver 100 are 4r×k bits plus r×k register bits for the registers 134, 136, 138, 140.

The register 142 receives a bit value specifying the row number, which is set initially to R−1. With each processing cycle, the register 142 outputs a bit value signifying the column number, which is initially set not equal to zero. The register 142 thereby serves to reset the column index each time the row number cycles through all of the rows.

With each processing cycle, the input MUX 110 generates a value of either 1 or −1, depending upon whether a RunBackwards flag is set. The value is provided to the adder 148, which adds the value to a bit value denoted NextRow. The resultant sum is provided to a data input of the row counter 126. A value of 1 is provided to a second input of the row counter 126. The row counter 126 produces a row value (stored initially as R−1 in the register 142), which is provided to the second bit-reversal logic block 130. The row value is also provided to each of the LUTs 102, 104, 106, 108. The row value is also provided to the adder 150, which adds the row value to a value of 1, and provides the resultant sum to the first bit-reversal logic block 128. This resultant sum is also provided to a first input of the MUX 112.

With each processing cycle, the first bit-reversal logic block 128 provides a value to a first input of the MUX 114. The second bit-reversal logic block 130 provides a row index value to a second input of the MUX 114, and also to a Y input of the address validation module 132. The address validation module 132 receives the value N at an X input. The address validation module 132 receives a value based upon the stored coefficients at a Z input. The LCS address validation module 132 calculates the product of C and the Y-input value, adds the product to the Z-input value, and checks whether the result is greater than or equal to the X-input value, N. If the computed value is greater than or equal to N, the address validation module 132 outputs a value of 1. Otherwise, the value of the output is 0. The output value is a flag denoted Addr_GT_N, which, when set to 1, signifies that the interleaver size is between successive powers of 2 such that the excess bits beyond the lower power of 2 should be discarded.

The Addr_GT_N value is provided as a selector input to the MUXes 112, 114, 120, and 122. The MUX 112 selects its first input if the Addr_GT_N value is set to 1. The selected input that is output from the MUX 112 is the interleaved Next Row value. The MUX 114 selects its first input if the Addr_GT_N value is set to 1. The selected input that is output from the MUX 114 represents is a final row index value.

The LCS recursion generation is performed as follows. With each processing cycle, a k-bit value representing the coefficient c is sent from the first LUT 102 to the data-path k-bit adder 152. The value a is sent from the second LUT 104 to a first input of the MUX 116. A value representing a taken to the power b is sent from the third LUT 106 to a second input of the MUX 116. The MUX 116 receives the RunBackwards flag at a selector input. If the Run Backwards value is 1, the MUX 116 selects its second input and provides the selected value, a k-bit value, to the multiplier 144. Otherwise, the MUX 116 provides its first input, a k-bit value, to the multiplier 144. The value x(−1) is sent from the fourth LUT 108 to a first input of the MUX 118. The MUX 118 receives at a second input a k-bit value output from the MUX 124. The MUX 118 receives a column index value at a selector index. The column index value is initially set not equal to zero. If the column index value is 1, the MUX 118 selects its second input. Otherwise, the MUX 118 selects its first input. The selected input value, a k-bit value, is provided to the multiplier 144. The resultant product from the multiplier 144 is provided to the k-bit adder 152. Advantageously, the data-path k-bit adder 152 is a programmable adder/subtractor, as known in the art. When the interleaver 100 is running backward, the adder 152 subtracts the value c.

The k-bit adder 152 provides an output value with each processing cycle to the Z input of the address validation module 132. The output of the adder 152 is also provided to a first input of the MUX 120 and to each of the first through the (R−1)th row registers 136, 138, 140. The output of the adder 152 is also provided as a k-bit input value to a first input of the MUX 122.

The MUX 120 receives a second input value from the k-bit adder 154. If the selector input of the MUX 120 is set to 1, the MUX 120 selects its first input. Otherwise, the MUX 120 selects its second input. The selected input is provided to the zero-th row register 134. Each row register 134, 136, 138, 140 provides an output value to respective inputs of the MUX 124. Additionally, the output value from the zero-th row register 134 is provided to is provided to the multiplier 146. The MUX 124 receives the row value (the output of the row counter 126) at a selector input. The row-register input selected by the MUX 124 depends upon the value of the row value at the selector input. Thus, each row register 134, 136, 138, 140 is updated when the row value is equal to the respective row register number, and the zero-th row register 134 is also enabled when the flag Addr_GT_N is equal to zero.

A k-bit initial input value b for R=0 is provided to the multiplier 146. The multiplier 146 also receives a value output from the zero-th row register 134. The multiplier 146 multiplies the two received values together and provides the resultant product to the k-bit adder 154. The data-path k-bit adder 154 also receives an initial input value c for R=0. Advantageously, the data-path k-bit adder 154 is a programmable adder/subtractor, as known in the art. When the interleaver 100 is running backward, the adder 154 subtracts the initial value c. The adder 154 sums (or, as programmed, subtracts) the two received values. The resultant sum, a k-bit value, is provided to a second input of the MUX 122.

The MUX 122 selects its first input if its selector input is set to 1. Otherwise, the MUX 122 selects its second input. The MUX 122 outputs the selected input as a final column index value. The address for the next bit value is the product of R and the final row index value output from the MUX 122, summed with the final column index value output from the MUX 114.

In one embodiment an LCS with period M is recursively generated according to the following identity:

$$x(n+1)=(ax(n)+c)_{mod\ M}$$

with integers a, c, and M satisfying the following three conditions: (1) c must be relatively prime to M. (2) a−1 must be a multiple of p, where p is any prime number that divides M. When M is a multiple of 4, a−1 must be a multiple of 4. (3) x(0) is the seed value, which can be any integer. To simplify the implementation, M may advantageously be chosen to be a power of 2. Thus, a must be in the form of 4p+1, while c can be taken as any odd number. It should be noted that while x(0) is used above to denote the initial condition, x(−1) is used to denote the initial condition in the embodiment described in connection with FIG. 2. No significance is to be attached to the different numbers used.

A 2-D, LCS interleaver in accordance with one embodiment is specified as follows: Letting the interleaving size be $K=2^N$, the interleaver is specified as a rectangular matrix with R rows and C columns, where both R and C are given by powers of 2. The data to be interleaved is written into the matrix row by row. The rows of data are first permuted (i.e., interleaved) according to any conventional interleaving rule. Advantageously, the rows of data are permutated according to a bit-reversal rule applied to the row index. Within each row the columns (i.e., the data elements, as each column has one data element per row) are permutated according to the rule specified by an associated LCS. The LCSs associated with two distinct rows are advantageously different, but may, in the alternative, be the same. After permutation of all of the rows, the data is read out in a column-by-column fashion to yield an interleaved sequence. As those of skill in the art would understand, an interleaver with length less than $2^N$ and greater than $2^{N-1}$ can be generated by deleting the invalid addresses from an interleaver of length of $2^N$.

In one embodiment a 2-D, LCS interleaver includes the following specifications: The interleaver size is 32 (i.e., N=5), and the data array is defined as {d(0), d(1), d(2), ... d(31)}. The interleaver is organized as an array with four rows and eight elements per row. The data elements are filled row by row in the following manner:

$$\begin{pmatrix} d(0) & d(1) & d(2) & d(3) & d(4) & d(5) & d(6) & d(7) \\ d(8) & d(9) & d(10) & d(11) & d(12) & d(13) & d(14) & d(15) \\ d(16) & d(17) & d(18) & d(19) & d(20) & d(21) & d(22) & d(23) \\ d(24) & d(25) & d(26) & d(27) & d(28) & d(29) & d(30) & d(31) \end{pmatrix}$$

The row indexes in binary (00, 01, 10, 11) may advantageously be bit reversed (i.e., 00, 10, 01, 11) and the rows are permuted accordingly to obtain $$\begin{pmatrix} d(0) & d(1) & d(2) & d(3) & d(4) & d(5) & d(6) & d(7) \\ d(16) & d(17) & d(18) & d(19) & d(20) & d(21) & d(22) & d(23) \\ d(8) & d(9) & d(10) & d(11) & d(12) & d(13) & d(14) & d(15) \\ d(24) & d(25) & d(26) & d(27) & d(28) & d(29) & d(30) & d(31) \end{pmatrix}$$

The bit reversal serves to shuffle rows of the interleaver in accordance with a predefined bit-reversal algorithm. Application of a bit reversal algorithm provides desirable time separation between the rows of the interleaver. Nevertheless, bit reversal is not necessary for implementation of the interleaver.

In a particular embodiment, the permutation LCSs are generated according to the following equations:

$$x_1(n+1)=(5x_1(n)+7)_{mod\ 8},\ \text{with}\ x_1(0)=3,$$

$$x_2(n+1)=(x_2(n)+5)_{mod\ 8},\ \text{with}\ x_2(0)=0,$$

$$x_3(n+1)=(5x_3(n)+3)_{mod\ 8},\ \text{with}\ x_3(0)=4,$$

and $$x_4(n+1)=(x_4(n)+3)_{mod\ 8},\ \text{with}\ x_4(0)=3.$$

The permutation patterns are given by {3, 6, 5, 0, 7, 2, 1, 4}, {0, 5, 2, 7, 4, 1, 6, 3}, {4, 7, 6, 1, 0, 3, 2, 5}, and {7, 2, 5, 0, 3, 6, 1, 4} for the four rows, respectively. Therefore, after applying the column permutation, the first row becomes:

$$(d(3)\ d(6)\ d(5)\ d(0)\ d(7)\ d(2)\ d(1)\ d(4)),$$

the second row becomes:

$$(d(16)\ d(21)\ d(18)\ d(23)\ d(20)\ d(17)\ d(22)\ d(19)),$$

the third row becomes:

$$\{d(12)\ d(15)\ d(14)\ d(9)\ d(8)\ d(11) d(10)\ d(13)\},$$

and the fourth row becomes:

$$\{d(31)\ d(26)\ d(29)\ d(24)\ d(27)\ d(30)\ d(25)\ d(28)\}.$$

After all of the columns are permutated within their respective rows, the interleaved data matrix has the following form:

$$\begin{pmatrix} d(3) & d(6) & d(5) & d(0) & d(7) & d(2) & d(1) & d(4) \\ d(16) & d(21) & d(18) & d(23) & d(20) & d(17) & d(22) & d(19) \\ d(12) & d(15) & d(14) & d(9) & d(8) & d(11) & d(10) & d(13) \\ d(31) & d(26) & d(29) & d(24) & d(27) & d(30) & d(25) & d(28) \end{pmatrix}.$$

The data in the interleaved matrix is read out column by column, yielding the following interleaved sequence: {d(3), d(16), d(12), d(31), d(6), d(21), d(15), d(26), d(5), d(18), d(14), ... , d(11), d(30) d(1), d(22), d(10), d(25), d(4), d(19), d(13), d(28)}. If an interleaver of length 30 is desired, the interleaver generated as described above can be shortened by deleting the data elements d(30) and d(31), producing the following interleaved sequence: {d(3), d(16), d(12), d(6), d(21), d(15), d(26), d(5), d(18), d(14), . . . , d(11), d(1), d(22), d(10), d(25), d(4), d(19), d(13), d(28)}.

The LCSs employed in the interleaver construction can be generated either forward or backward, as desired, for optimum use with MAP decoders in turbo decoding. In one embodiment the reverse sequence generation is given by the following equation:

$$x(n)=(a^\beta x(n+1)-c)_{mod\ M},$$

where $$\beta=(M/2)-1.$$

It should be noted that the term β, as used the above equations, represents the coefficient b described in connection with the embodiment of FIG. 2.

Thus, generation of the LCS requires that each interleaver be uniquely defined by 3R parameters, where R is the number of rows. A relatively short, $\log_2(C) \times \log_2(C)$ multiplier is needed. Due to the modulo operation, it is not necessary to generate the bits above bit location $\log_2(C)$. One set of R registers is needed to hold the intermediate results of the R congruent sequences.

With different parameters x(0), a, and b for each row, there are many different possibilities for the permutation sequences. It is desirable to perform a search to optimize the interleaver parameters for use with specific turbo codes.

Figure 3:
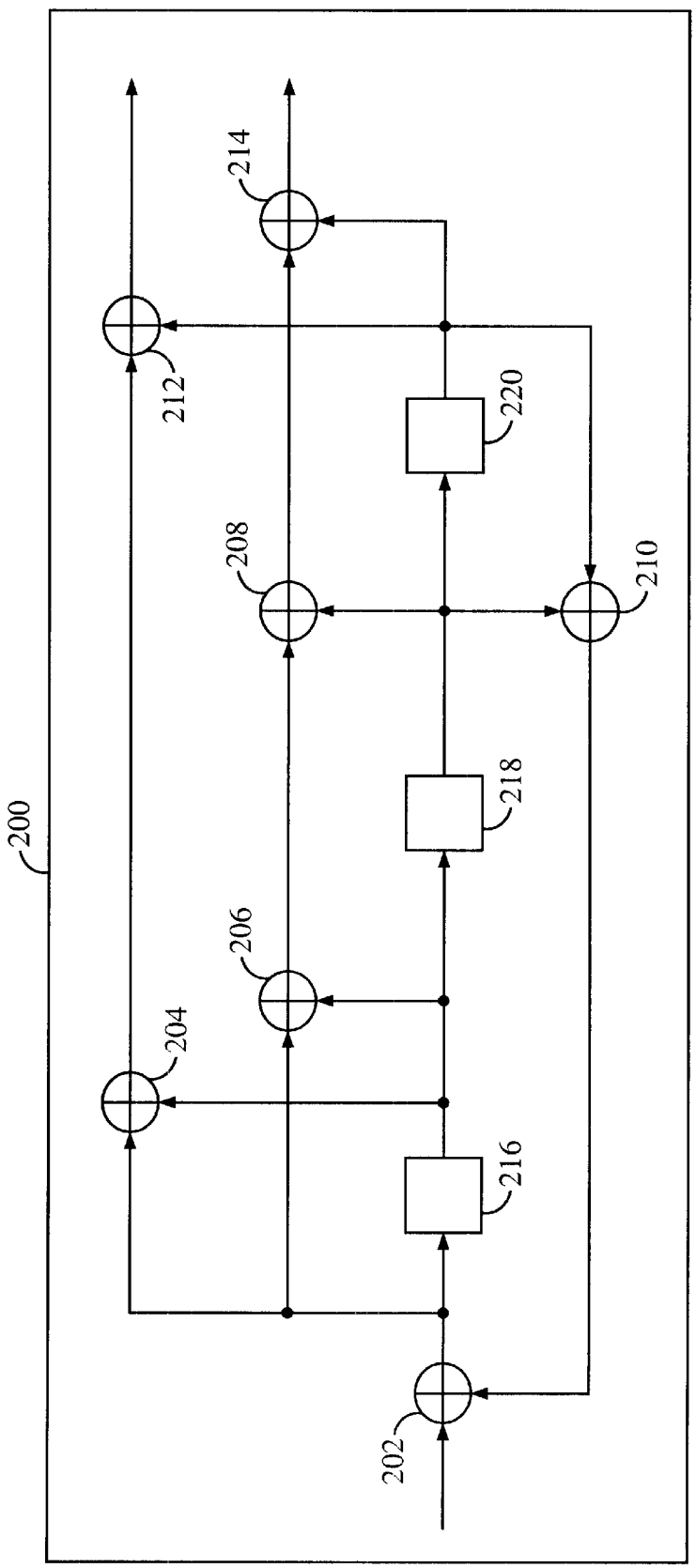
FIG. 3 is a block diagram of a constituent encoder that may be used in conjunction with the interleaver of FIG. 2.

In FIG. 3 a constituent encoder 200 in accordance with one embodiment is optimized for a specific turbo code used in a CDMA digital wireless communications system. The encoder 200 includes seven modulo-2 adders 202, 204, 206, 208, 210, 212, 214 and three bit locations 216, 218, 220. The bit locations 216, 218, 220 may be implemented as a three-bit register, or alternatively, three one-bit registers. The modulo-2 adders 202, 204, 206, 208, 210, 212, 214 are coupled to the bit locations 216, 218, 220 in a precise manner so as to produce a desired set of feedback taps. Thus, the adder 202 is configured to receive an input bit. The adder 202 is also coupled the bit location 216 and to the adders 204 and 206. The bit location 216 is coupled to the bit location 218 and to the adders 204 and 206. The bit location 218 is coupled to the bit location 220 and to the adders 208 and 210. The adder 210 is coupled to the adder 202. The adder 204 is coupled to the adder 212. The adder 206 is coupled to the adder 208. The adder 208 is coupled to the adder 214. The bit location 220 is coupled to the adders 210, 214, and 212. The adders 212, 214 are configured to output, respectively, first and second symbols.

It is known in the art that error performance can be characterized by the input and output weight of error events in the constituent decoders (not shown). See, e.g., S. Benedetto & G. Montorsi, *Unveiling Turbo Codes: Some Results on Parallel Concatenated Coding Schemes*, 42 *IEEE Trans. Info. Theory* 409–28 (March 1996). The input weight of an error event is the number of bit errors, whereas the output weight of an error event is the number of code symbol errors. An error event of input weight 1 clearly will diverge from the all-zeros state and never remerge (the 1 will cycle endlessly in the shift register, accumulating more and more output weight along the way). This is due to the recursive, or feedback, portion of the encoder. Due to this structure, it has been shown that the performance of turbo codes at high signal-to-noise-ratio (SNR) is dominated by output error events with input weight 2. See id. The turbo code error floor can be accurately predicted using the so-called effective free distance asymptote. The effective free distance is the minimum output weight of all error events of input weight 2. The input weight 2 error events that are short in length will, typically, cause the minimum distance error events. For the encoder 200 of FIG. 3, the feedback polynomial is $1+D^2+D^3$, and all possible input weight 2 error events are of the form $D^k(1+D^{7j})$, where j=1,2, . . . and k is an arbitrary shift in the range 0, . . . , K−7j (K is assumed to be the interleaver size). This can be easily verified by examining the trellis of the constituent encoder 200, as would be understood by those of skill in the art.

It should be noted that the interleaver size for the embodiment of FIG. 3 is denoted K, while the interleaver size for the embodiment of FIG. 2 is denoted N. Those of skill would appreciate that no special significance is to be imported to the fact that different letters are used.

Suppose, for example, that an error pattern of $D^k(1+D^7)$ causes a minimum distance error event out of the first decoder. The turbo interleaver will map the two errors ($D^k$, $D^{k+7}$) into two positions ($D^n$, $D^m$). If |m−n|=7 or some multiple of 7, a low distance error event out of the second decoder is likely. The fundamental purpose of the turbo interleaver is to prevent such mappings from occurring. Namely, the interleaver should advantageously map collections of bits that are prone to low weight error events in the first dimension into collections of bits that generate a large amount of output weight in the second dimension. Therefore, a desirable approach to design of the interleaver is to try to prevent bit pairs located at indices (k, k+7j) from mapping into bit pairs located at indices (s, s+7t), with particular emphasis on the smaller values of j and t. Such input error events are listed in Table 1, below. For each event, the output parity weight of the first constituent code is listed, using the appropriate puncturing patterns for the rate ½, ⅓, and ¼ forward-link turbo codes, as specified in IS-95.

TABLE 1

| | Input Weight 2 Error Events | | | |
|---|---|---|---|---|
| | Input | 1st Constituent Output Weight | | |
| Input Error Event | Length | Rate ½ | Rate ⅓ | Rate ¼ |
| $D^k(1 + D^7)$ | 8 | 3 | 6 | 8 |
| $D^k(1 + D^{14})$ | 15 | 6 | 10 | 16 |
| $D^k(1 + D^{21})$ | 22 | 7 | 14 | 20 |
| $D^k(1 + D^{28})$ | 29 | 10 | 18 | 28 |

If a given interleaver contains an input weight 2→2 mapping of the form $D^{k_1}(1+D^7)\rightarrow D^{k_2}(1+D^7)$, then the composite output weight of the resulting error event will be 2+3+3=8 for a rate ½ turbo code. In the previous calculation, the weight of the systematic bits (2) is summed with the respective parity weight from the two constituent encoders (3 and 3). Similarly, if the interleaver contains an input weight 2→2 mapping of the form $D^{k_1}(1+D^7)\rightarrow D^{k_2}(1+D^{14})$, then the composite output weight of the resulting error event will be 2+3+6=11 for a rate ½ turbo code, or 2+6+10=18 for a rate ⅓ turbo code.

In addition, it is possible that input weight 4 error events of low constituent output weight may map into two input weight 2 error events of low output weight in the second dimension. Such mappings are denoted by 4→{2,2}. While there is no closed-form solution for constituent error events of input weight 4, the following table contains some of the low output weight error events for the constituent encoder 200, with the constituent encoder 200 being used as the first constituent encoder for forward-link turbo codes in a CDMA digital wireless communications system using an over-the-air interface derived from IS-95.

TABLE 2

| | Input Weight 4 Error Events | | | |
|---|---|---|---|---|
| | Input | 1st Constituent Output Weight | | |
| Input Error Event | Length | Rate ½ | Rate ⅓ | Rate ¼ |
| $D^k(1 + D^3 + D^4 + D^5)$ | 5 | 2 | 4 | 6 |
| $D^k(1 + D^1 + D^3 + D^6)$ | 6 | 2 | 4 | 8 |
| $D^k(1 + D^2 + D^4 + D^8)$ | 8 | 2 | 4 | 8 |
| $D^k(1 + D^1 + D^4 + D^9)$ | 9 | 2 | 4 | 8 |
| $D^k(1 + D^5 + D^{10} + D^{11})$ | 11 | 2 | 8 | 12 |
| $D^k(1 + D^1 + D^2 + D^4)$ | 4 | 3 | 4 | 6 |
| $D^k(1 + D^2 + D^5 + D^6)$ | 6 | 3 | 4 | 8 |
| $D^k(1 + D^1 + D^6 + D^{10})$ | 10 | 3 | 4 | 8 |
| $D^k(1 + D^4 + D^8 + D^9)$ | 9 | 3 | 8 | 10 |
| $D^k(1 + D^1 + D^3 + D^{13})$ | 13 | 3 | 8 | 12 |
| $D^k(1 + D^5 + D^9 + D^{13})$ | 13 | 3 | 8 | 12 |
| $D^k(1 + D^2 + D^4 + D^{15})$ | 15 | 3 | 8 | 12 |

TABLE 2-continued

Input Weight 4 Error Events

| Input Error Event | Input Length | 1st Constituent Output Weight | | |
|---|---|---|---|---|
| | | Rate ½ | Rate ⅓ | Rate ¼ |
| $D^k(1 + D^8 + D^{14} + D^{15})$ | 15 | 3 | 8 | 12 |
| $D^k(1 + D^6 + D^9 + D^{12})$ | 12 | 3 | 8 | 14 |
| $D^k(1 + D^2 + D^{12} + D^{13})$ | 13 | 3 | 8 | 14 |
| $D^k(1 + D^6 + D^{10} + D^{15})$ | 15 | 3 | 8 | 14 |
| $D^k(1 + D^1 + D^7 + D^8)$ | 8 | 4 | 4 | 8 |
| $D^k(1 + D^5 + D^6 + D^9)$ | 9 | 4 | 8 | 10 |
| $D^k(1 + D^1 + D^2 + D^{11})$ | 11 | 4 | 8 | 10 |
| $D^k(1 + D^4 + D^7 + D^{11})$ | 11 | 4 | 8 | 10 |
| $D^k(1 + D^8 + D^9 + D^{11})$ | 11 | 4 | 8 | 10 |
| $D^k(1 + D^2 + D^7 + D^9)$ | 9 | 4 | 8 | 12 |
| $D^k(1 + D^3 + D^7 + D^{10})$ | 10 | 4 | 8 | 12 |
| $D^k(1 + D^6 + D^8 + D^{10})$ | 10 | 4 | 8 | 12 |
| $D^k(1 + D^2 + D^5 + D^{13})$ | 13 | 4 | 8 | 12 |
| $D^k(1 + D^3 + D^8 + D^{13})$ | 13 | 4 | 8 | 12 |
| $D^k(1 + D^6 + D^7 + D^{13})$ | 13 | 4 | 8 | 12 |
| $D^k(1 + D^9 + D^{12} + D^{13})$ | 13 | 4 | 8 | 12 |
| $D^k(1 + D^1 + D^6 + D^{17})$ | 17 | 4 | 8 | 12 |
| $D^k(1 + D^8 + D^{13} + D^{17})$ | 17 | 4 | 8 | 12 |
| $D^k(1 + D^2 + D^6 + D^{12})$ | 12 | 4 | 8 | 14 |
| $D^k(1 + D^5 + D^7 + D^{12})$ | 12 | 4 | 8 | 14 |
| $D^k(1 + D^1 + D^{14} + D^{15})$ | 15 | 4 | 8 | 14 |
| $D^k(1 + D^2 + D^{11} + D^{15})$ | 15 | 4 | 8 | 14 |
| $D^k(1 + D^6 + D^{12} + D^{16})$ | 16 | 4 | 8 | 14 |
| $D^k(1 + D^5 + D^{13} + D^{16})$ | 16 | 4 | 12 | 18 |
| $D^k(1 + D^5 + D^{14} + D^{19})$ | 19 | 4 | 12 | 18 |
| $D^k(1 + D^6 + D^9 + D^{19})$ | 19 | 4 | 12 | 18 |

If, for example, the interleaver contains an input weight 4→{2,2} mapping of the form $D^{k_1}(1+D^3+D^4+D^5) \rightarrow \{D^{k_2}(1+D^7), D^{k_3}(1+D^7)\}$, then the composite output weight of the resulting error event will be 4+2+3+3=12 for a rate ½ turbo code. This composite error event is not much worse than the error event due to the mapping $D^{k_1}(1+D^7) \rightarrow D^{k_2}(1+D^{14})$, which has composite output weight 11. A primary design goal is, therefore, to optimize the parameters of the interleaver such that the above-described types of bad mappings are avoided, or at least minimized. Ideally, the bad mappings having the lowest composite output weight are the mappings most important to avoid and/or minimize. In designing an interleaver for a particular size (e.g., 1530) it is possible to optimize interleaver parameters so as to minimize both types of mappings (i.e., weight 2→2 and weight 4→{2,2}). This approach yields the optimal interleaver for that particular size. It should be pointed out that in designing an interleaver of size $2^N$ that can be robustly punctured down to any size greater than $2^{N-1}$ (which is referred to as a "puncture-friendly" interleaver) optimization for weight 4→{2,2} mappings may be more difficult to achieve.

A search was performed to obtain puncture-friendly interleavers of size $2^N$ from a 2-D, LCS interleaver in accordance with the embodiment of FIG. 3. Table 3, below, contains initial results of the search. For each interleaver size, the number of rows used and the number of columns used are specified along with the x(0), a, and c coefficients. For simplicity and efficiency in implementation, thirty-two rows were used for all interleavers.

TABLE 3

2-D LCS Interleaver Coefficients

| K = 512, 32 × 16 | | | K = 1024, 32 × 32 | | | K = 2048, 32 × 64 | | | K = 4096, 32 × 128 | | |
|---|---|---|---|---|---|---|---|---|---|---|---|

TABLE 3-continued

2-D LCS Interleaver Coefficients

| x(0) | A | c | x(0) | a | c | x(0) | a | c | x(0) | a | c |
|---|---|---|---|---|---|---|---|---|---|---|---|
| 14 | 9 | 11 | 30 | 29 | 9 | 24 | 45 | 63 | 95 | 61 | 63 |
| 6 | 1 | 13 | 17 | 29 | 5 | 41 | 53 | 53 | 7 | 121 | 119 |
| 6 | 1 | 11 | 19 | 9 | 1 | 46 | 53 | 41 | 29 | 113 | 105 |
| 10 | 13 | 15 | 31 | 1 | 17 | 46 | 5 | 43 | 28 | 29 | 53 |
| 6 | 5 | 13 | 19 | 17 | 31 | 9 | 29 | 13 | 16 | 25 | 97 |
| 7 | 9 | 11 | 11 | 13 | 19 | 15 | 37 | 39 | 69 | 33 | 33 |
| 1 | 9 | 5 | 18 | 13 | 21 | 13 | 53 | 19 | 41 | 93 | 81 |
| 4 | 9 | 5 | 20 | 9 | 27 | 28 | 1 | 57 | 34 | 1 | 117 |
| 14 | 5 | 9 | 31 | 21 | 11 | 20 | 29 | 5 | 100 | 69 | 75 |
| 11 | 13 | 9 | 29 | 21 | 17 | 1 | 49 | 39 | 69 | 113 | 39 |
| 12 | 9 | 5 | 26 | 25 | 21 | 15 | 33 | 31 | 40 | 13 | 15 |
| 10 | 9 | 1 | 19 | 29 | 15 | 9 | 33 | 19 | 13 | 33 | 19 |
| 10 | 13 | 13 | 11 | 13 | 7 | 30 | 21 | 5 | 23 | 77 | 123 |
| 1 | 5 | 5 | 1 | 1 | 27 | 61 | 37 | 45 | 84 | 9 | 127 |
| 11 | 1 | 1 | 24 | 13 | 31 | 12 | 45 | 7 | 87 | 65 | 113 |
| 2 | 5 | 11 | 10 | 5 | 29 | 9 | 37 | 19 | 16 | 17 | 81 |
| 4 | 9 | 11 | 23 | 29 | 29 | 12 | 37 | 53 | 85 | 117 | 69 |
| 15 | 9 | 5 | 26 | 1 | 15 | 59 | 13 | 25 | 103 | 41 | 73 |
| 14 | 1 | 3 | 28 | 21 | 23 | 18 | 25 | 37 | 50 | 73 | 5 |
| 9 | 1 | 9 | 11 | 21 | 11 | 9 | 49 | 31 | 91 | 73 | 35 |
| 7 | 1 | 7 | 16 | 21 | 3 | 17 | 45 | 29 | 59 | 73 | 59 |
| 13 | 13 | 13 | 17 | 13 | 11 | 50 | 25 | 23 | 87 | 97 | 39 |
| 6 | 13 | 9 | 10 | 21 | 13 | 26 | 21 | 41 | 47 | 125 | 3 |
| 1 | 13 | 15 | 13 | 17 | 7 | 14 | 61 | 45 | 34 | 21 | 33 |
| 7 | 1 | 7 | 24 | 9 | 5 | 12 | 25 | 37 | 120 | 57 | 103 |
| 2 | 5 | 15 | 17 | 25 | 1 | 34 | 33 | 55 | 76 | 77 | 103 |
| 5 | 5 | 9 | 10 | 21 | 25 | 10 | 29 | 59 | 19 | 13 | 73 |
| 0 | 9 | 1 | 28 | 21 | 27 | 16 | 13 | 15 | 49 | 121 | 111 |
| 10 | 5 | 1 | 13 | 25 | 9 | 29 | 37 | 41 | 4 | 97 | 97 |
| 9 | 9 | 13 | 21 | 13 | 3 | 33 | 5 | 33 | 13 | 101 | 71 |
| 3 | 9 | 1 | 4 | 17 | 27 | 30 | 49 | 51 | 73 | 9 | 77 |
| 11 | 9 | 3 | 18 | 29 | 29 | 0 | 21 | 47 | 102 | 101 | 1 |

| K = 8192, 32 × 256 | | | K = 16384 32 × 512 | | | K = 32768, 32 × 1024 | | |
|---|---|---|---|---|---|---|---|---|
| X(0) | A | c | X(0) | a | c | x(0) | a | c |
| 40 | 37 | 249 | 181 | 45 | 289 | 939 | 281 | 913 |
| 73 | 53 | 59 | 75 | 217 | 223 | 9 | 85 | 969 |
| 88 | 177 | 105 | 251 | 125 | 257 | 463 | 989 | 165 |
| 46 | 29 | 91 | 89 | 141 | 457 | 363 | 981 | 59 |
| 199 | 73 | 141 | 304 | 29 | 31 | 637 | 437 | 751 |
| 211 | 185 | 133 | 328 | 153 | 161 | 599 | 597 | 621 |
| 85 | 193 | 181 | 428 | 17 | 451 | 971 | 173 | 615 |
| 18 | 169 | 209 | 394 | 245 | 147 | 1007 | 157 | 79 |
| 246 | 81 | 89 | 178 | 321 | 111 | 444 | 693 | 415 |
| 192 | 85 | 71 | 186 | 217 | 227 | 339 | 205 | 331 |
| 144 | 189 | 223 | 438 | 357 | 423 | 382 | 293 | 565 |
| 6 | 129 | 73 | 465 | 85 | 261 | 505 | 981 | 259 |
| 118 | 69 | 119 | 24 | 185 | 109 | 728 | 845 | 447 |
| 221 | 217 | 127 | 415 | 417 | 465 | 139 | 953 | 383 |
| 241 | 109 | 27 | 225 | 137 | 33 | 682 | 537 | 461 |
| 235 | 209 | 133 | 77 | 61 | 265 | 487 | 293 | 903 |
| 181 | 189 | 235 | 158 | 45 | 211 | 453 | 9 | 885 |
| 126 | 245 | 37 | 278 | 373 | 255 | 352 | 729 | 619 |
| 129 | 173 | 191 | 410 | 117 | 175 | 442 | 81 | 315 |
| 222 | 9 | 43 | 275 | 253 | 429 | 537 | 945 | 519 |
| 89 | 113 | 159 | 35 | 85 | 289 | 201 | 13 | 175 |
| 21 | 13 | 205 | 496 | 249 | 15 | 459 | 745 | 97 |
| 75 | 253 | 183 | 79 | 365 | 221 | 592 | 69 | 829 |
| 195 | 149 | 71 | 257 | 449 | 337 | 803 | 909 | 385 |
| 45 | 101 | 209 | 232 | 81 | 137 | 133 | 425 | 201 |
| 246 | 193 | 159 | 385 | 121 | 87 | 965 | 109 | 1001 |
| 228 | 85 | 97 | 138 | 429 | 73 | 707 | 685 | 105 |
| 0 | 161 | 151 | 479 | 9 | 23 | 627 | 289 | 97 |
| 191 | 45 | 31 | 158 | 141 | 51 | 1019 | 805 | 753 |
| 162 | 165 | 35 | 442 | 481 | 71 | 101 | 69 | 573 |
| 196 | 149 | 191 | 464 | 269 | 157 | 521 | 753 | 183 |
| 94 | 157 | 197 | 413 | 505 | 237 | 290 | 221 | 181 |

In an alternate embodiment, the coefficient a may be set equal to 1, with a new search being performed to obtain puncture-friendly interleavers of size $2^N$ from a 2-D, LCS interleaver. The forward and reverse LCS recursion equations simplify, respectively, to the following:

$$x(n+1)=(x(n)+c) \bmod M,$$

and $$x(n)=(x(n+1)-c) \bmod M.$$

Table 4, below, contains initial results of the search. For simplicity and efficiency in implementation, thirty-two rows were used for all interleavers. Those skilled in the art would understand from the results shown in Table 4 that setting a equal to 1 in all LCS recursions induces no penalty in the quality of the resulting interleavers. Moreover, the complexity gains achieved from the simplification of setting a equal to 1 are substantial. For example, the second and third LUTs described in the embodiment of FIG. 2 (the LUTs used to store the values of a and $a^b$) are not needed. The k-bit multipliers described in the embodiment of FIG. 2 are also not necessary. As can be seen from Table 4, below, only the initial condition x(-1) and the additive constant c need be specified for each row of the interleaver. Coefficients for the larger sized interleaver are not included in the table, which specifies initial search results only, because they were not available as of the time of filing of the present application.

tion lend themselves equally well to application in any form of communications system, including, e.g., a satellite communications system. It would further be understood by those skilled in the art that the embodiments described herein may be used to encode either data or voice communications. It would also be understood that the data, instructions, commands, information, signals, bits, symbols, and chips that may be referenced throughout the above description are advantageously represented by voltages, currents, electromagnetic waves, magnetic fields or particles, optical fields or particles, or any combination thereof.

Those of skill would further appreciate that the various illustrative logical blocks and algorithm steps described in connection with the embodiments disclosed herein may be implemented or performed with a digital signal processor (DSP), an application specific integrated circuit (ASIC), discrete gate or transistor logic, discrete hardware components such as, e.g., registers and FIFO, a processor executing a set of firmware instructions, or any conventional programmable software module and a processor. The processor may advantageously be a microprocessor, but in the alternative, the processor may be any conventional processor, controller, microcontroller, or state machine. The software module could reside in RAM memory, flash memory, registers, or any other form of writable storage medium known in the art.

Preferred embodiments of the present invention have thus been shown and described. It would be apparent to one of

TABLE 4

2-D LCS Interleaver Coefficients

| K = 512, 32 × 16 | | K = 1024, 32 × 32 | | K = 2048, 32 × 64 | | K = 4096, 32 × 128 | | K = 8192, 32 × 256 | | K = 16384, 32 × 512 | | K = 32768, 32 × 1024 | |
|---|---|---|---|---|---|---|---|---|---|---|---|---|---|
| x(-1) | C | x(-1) | C | x(-1) | C | x(-1) | c | x(-1) | c | x(-1) | c | x(-1) | c |
| 1 | 1 | 1 | 3 | 0 | 5 | — | — | — | — | — | — | — | — |
| 11 | 9 | 14 | 1 | 1 | 1 | — | — | — | — | — | — | — | — |
| 11 | 15 | 5 | 13 | 14 | 1 | — | — | — | — | — | — | — | — |
| 1 | 5 | 13 | 27 | 3 | 23 | — | — | — | — | — | — | — | — |
| 1 | 5 | 3 | 17 | 9 | 25 | — | — | — | — | — | — | — | — |
| 6 | 7 | 3 | 13 | 8 | 3 | — | — | — | — | — | — | — | — |
| 6 | 15 | 25 | 5 | 4 | 1 | — | — | — | — | — | — | — | — |
| 12 | 11 | 3 | 23 | 57 | 61 | — | — | — | — | — | — | — | — |
| 14 | 13 | 2 | 19 | 0 | 5 | — | — | — | — | — | — | — | — |
| 15 | 7 | 1 | 13 | 60 | 49 | — | — | — | — | — | — | — | — |
| 13 | 15 | 8 | 5 | 1 | 9 | — | — | — | — | — | — | — | — |
| 4 | 5 | 25 | 9 | 47 | 55 | — | — | — | — | — | — | — | — |
| 15 | 5 | 14 | 9 | 20 | 25 | — | — | — | — | — | — | — | — |
| 14 | 5 | 11 | 23 | 34 | 19 | — | — | — | — | — | — | — | — |
| 12 | 3 | 17 | 13 | 46 | 1 | — | — | — | — | — | — | — | — |
| 3 | 15 | 19 | 13 | 52 | 13 | — | — | — | — | — | — | — | — |
| 14 | 13 | 4 | 39 | 8 | 75 | — | — | — | — | — | — | — | — |
| 8 | 19 | 17 | 35 | 35 | 67 | — | — | — | — | — | — | — | — |
| 12 | 15 | 24 | 27 | 48 | 51 | — | — | — | — | — | — | — | — |
| 14 | 11 | 28 | 23 | 57 | 47 | — | — | — | — | — | — | — | — |
| 14 | 11 | 29 | 19 | 59 | 35 | — | — | — | — | — | — | — | — |
| 6 | 27 | 12 | 51 | 24 | 103 | — | — | — | — | — | — | — | — |
| 7 | 31 | 14 | 59 | 29 | 115 | — | — | — | — | — | — | — | — |
| 2 | 23 | 4 | 47 | 9 | 91 | — | — | — | — | — | — | — | — |
| 1 | 27 | 2 | 55 | 4 | 107 | — | — | — | — | — | — | — | — |
| 2 | 15 | 5 | 27 | 11 | 55 | — | — | — | — | — | — | — | — |
| 13 | 7 | 26 | 11 | 52 | 19 | — | — | — | — | — | — | — | — |
| 9 | 3 | 19 | 3 | 38 | 7 | — | — | — | — | — | — | — | — |
| 12 | 11 | 24 | 23 | 49 | 47 | — | — | — | — | — | — | — | — |
| 14 | 15 | 28 | 31 | 56 | 63 | — | — | — | — | — | — | — | — |
| 11 | 19 | 22 | 35 | 45 | 67 | — | — | — | — | — | — | — | — |
| 12 | 15 | 25 | 27 | 50 | 51 | — | — | — | — | — | — | — | — |

Thus, a novel and improved turbo code interleaver using linear congruential sequences has been described. Those of skill in the art would understand that while the embodiments disclosed herein have been described in the context of a cellular telephone system, the features of the instant invention lend themselves equally well to application in any form ordinary skill in the art, however, that numerous alterations may be made to the embodiments herein disclosed without departing from the spirit or scope of the invention. Therefore, the present invention is not to be limited except in accordance with the following claims.

What is claimed is:

1. A turbo decoder, comprising:
a first coder configured to receive a plurality of input bits in succession and generate a first plurality of output symbols therefrom;
an interleaver configured to receive the plurality of input bits in succession, the interleaver including a plurality of bit storage locations arranged in a matrix of rows and columns and a linear congruential sequence generator configured to pseudo-random generate a sequence for shuffling bits within each row of the interleaver; and
a second coder configured to receive a plurality of interleaved bits in succession from the interleaver and generate a second plurality of output symbols therefrom
wherein the first and second coders are configured to iteratively decode the plurality of input bits.

2. The turbo decoder as in claim 1, wherein the interleaver is further configured to receive the second plurality of output symbols in succession, and wherein the linear congruential sequence generator is configured to pseudo-random generate an inverse sequence for shuffling bits within each row of the interleaver.

3. The turbo decoder as in claim 2, wherein the interleaver is configured to generate an output to the first coder, wherein the output identifies addresses for each of the second plurality of output symbols.

4. The turbo decoder as in claim 1, wherein the turbo decoder is configured to receive the plurality of input bits from a high data rate channel.

5. A wireless apparatus configured for turbo coding, comprising:
a first coder configured to receive a plurality of input bits in succession and generate a first plurality of output symbols therefrom;
an interleaver configured to receive the plurality of input bits in succession, the interleaver including a plurality of bit storage locations arranged in a matrix of rows and columns and a linear congruential sequence generator configured to pseudo-random generate a sequence for shuffling bits within each row of the interleaver; and
a second coder configured to receive a plurality of interleaved bits in succession from the interleaver and generate a second plurality of output symbols therefrom,
wherein the first and second coders are configured to iteratively decode the plurality of input bits.

6. A method for turbo decoding, comprising:
decoding a plurality of input bits in succession to generate a first plurality of output symbols therefrom;
interleaving the first plurality of output symbols in succession, the interleaving comprising:
generating a linear congruential sequence value for at least a portion of the plurality of input bits, each of the linear congruential sequence values identifying a first parameter for the plurality of input bits; and
generating a second plurality of output symbols as a function of the linear congruential sequence values; and
decoding the second plurality of output symbols.

7. The method as in claim 6, wherein generating a linear congruential sequence value comprises:
calculating a reverse sequence generation given as:

$$x(n) = (a^\beta x(n+1) - c)_{mod\ M},$$

wherein $$\beta = (M/2) - 1.$$

8. An apparatus for turbo decoding, comprising:
means for decoding a plurality of input bits in succession to generate a first plurality of output symbols therefrom;
means for interleaving the first plurality of output symbols in succession, the means for interleaving comprising:
means for generating a linear congruential sequence value for at least a portion of the plurality of input bits, each of the linear congruential sequence values identifying a first parameter for the plurality of input bits; and
means for generating a second plurality of output symbols as a function of the linear congruential sequence values; and
means for decoding the second plurality of output symbols.

9. The method as in claim 8, wherein the means for generating a linear congruential sequence value comprises:
means for calculating a reverse sequence generation given as:

$$x(n) = (a^\beta x(n+1) - c)_{mod\ M},$$

wherein $$\beta = (M/2) - 1.$$

10. A wireless apparatus configured for turbo coding, comprising:
a memory storage unit including a plurality of bit storage locations arranged in a matrix of rows and columns; and
a processor configured to:
receive a plurality of input bits in succession and generate a first plurality of output symbols therefrom, the first plurality of output symbols stored in the matrix of the memory storage unit;
pseudo-random generate a sequence for shuffling bits within each row of the matrix; and
receive the shuffled bits and generate a second plurality of output symbols therefrom.

* * * * *